(12) United States Patent
Kim

(10) Patent No.: US 8,871,558 B2
(45) Date of Patent: Oct. 28, 2014

(54) METHOD OF MANUFACTURING ORGANIC ELECTROLUMINESCENT DISPLAY

(71) Applicant: Samsung Display Co., Ltd., Yongin (KR)

(72) Inventor: Gun Mo Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/916,037

(22) Filed: Jun. 12, 2013

(65) Prior Publication Data

US 2014/0080237 A1    Mar. 20, 2014

(30) Foreign Application Priority Data

Sep. 19, 2012    (KR) .................. 10-2012-0104128

(51) Int. Cl.
- *H01L 21/00* (2006.01)
- *H01L 51/00* (2006.01)
- *H01L 51/56* (2006.01)
- *H01L 27/32* (2006.01)

(52) U.S. Cl.
CPC ............ *H01L 51/56* (2013.01); *H01L 51/0011* (2013.01); *H01L 27/3211* (2013.01)
USPC ................... 438/88; 438/28; 438/34; 257/40; 257/E51.018

(58) Field of Classification Search
None
See application file for complete search history.

(56) References Cited

U.S. PATENT DOCUMENTS

| | | | |
|---|---|---|---|
| 7,638,375 B2 * | 12/2009 | Chin et al. .................... | 438/158 |
| 7,663,140 B2 | 2/2010 | Yamazaki et al. | |
| 8,030,146 B2 * | 10/2011 | Lin et al. ....................... | 438/162 |
| 8,106,402 B2 * | 1/2012 | Yeo et al. ......................... | 257/72 |
| 2005/0142976 A1 * | 6/2005 | Suzuki ............................ | 445/24 |
| 2007/0102714 A1 * | 5/2007 | Lee et al. ......................... | 257/88 |
| 2007/0126000 A1 * | 6/2007 | Lin et al. ......................... | 257/40 |
| 2008/0003726 A1 * | 1/2008 | Park .............................. | 438/149 |
| 2008/0230798 A1 * | 9/2008 | Huang et al. .................... | 257/99 |
| 2009/0278131 A1 * | 11/2009 | Kwon et al. ..................... | 257/72 |
| 2012/0018749 A1 | 1/2012 | Lee et al. | |
| 2013/0302572 A1 * | 11/2013 | Sonoda et al. ............... | 428/172 |

FOREIGN PATENT DOCUMENTS

| | | |
|---|---|---|
| KR | 10-2007-0015967 | 2/2007 |
| KR | 10-2012-0010042 | 2/2012 |
| WO | WO 2005/115059 A1 | 12/2005 |

* cited by examiner

*Primary Examiner* — Charles Garber
*Assistant Examiner* — Evren Seven
(74) *Attorney, Agent, or Firm* — Knobbe Martens Olson & Bear LLP

(57) ABSTRACT

In a method of manufacturing an organic electroluminescent display, when a substrate including first and second pixel areas is prepared, a first mask including openings is disposed on the substrate to respectively correspond to the first and second pixel areas, and a second mask including an opening corresponding to the first pixel area is disposed on the first mask to expose the first pixel area and cover the second pixel area. Then, a first organic light emitting material is provided to the substrate to form the first organic light emitting material in the first pixel area and the second mask is removed from the substrate to expose the first and second pixel areas. Thereafter, a second organic light emitting material is provided to the substrate to form the second light emitting material in the first and second pixel areas and the first mask is removed from the substrate.

18 Claims, 18 Drawing Sheets

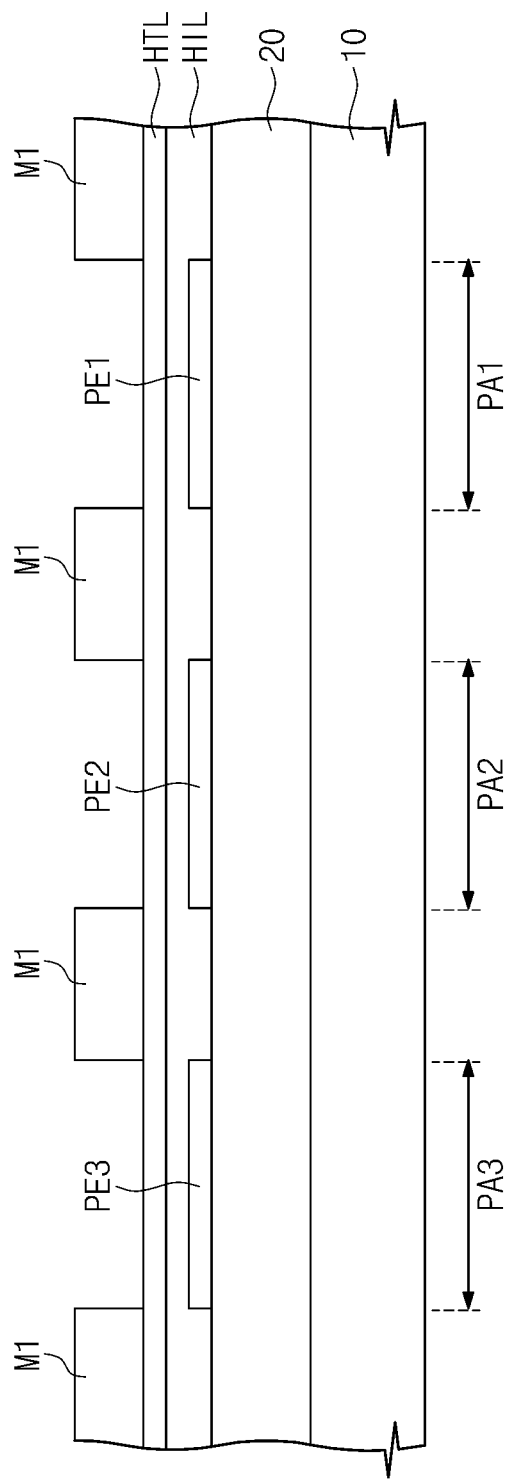

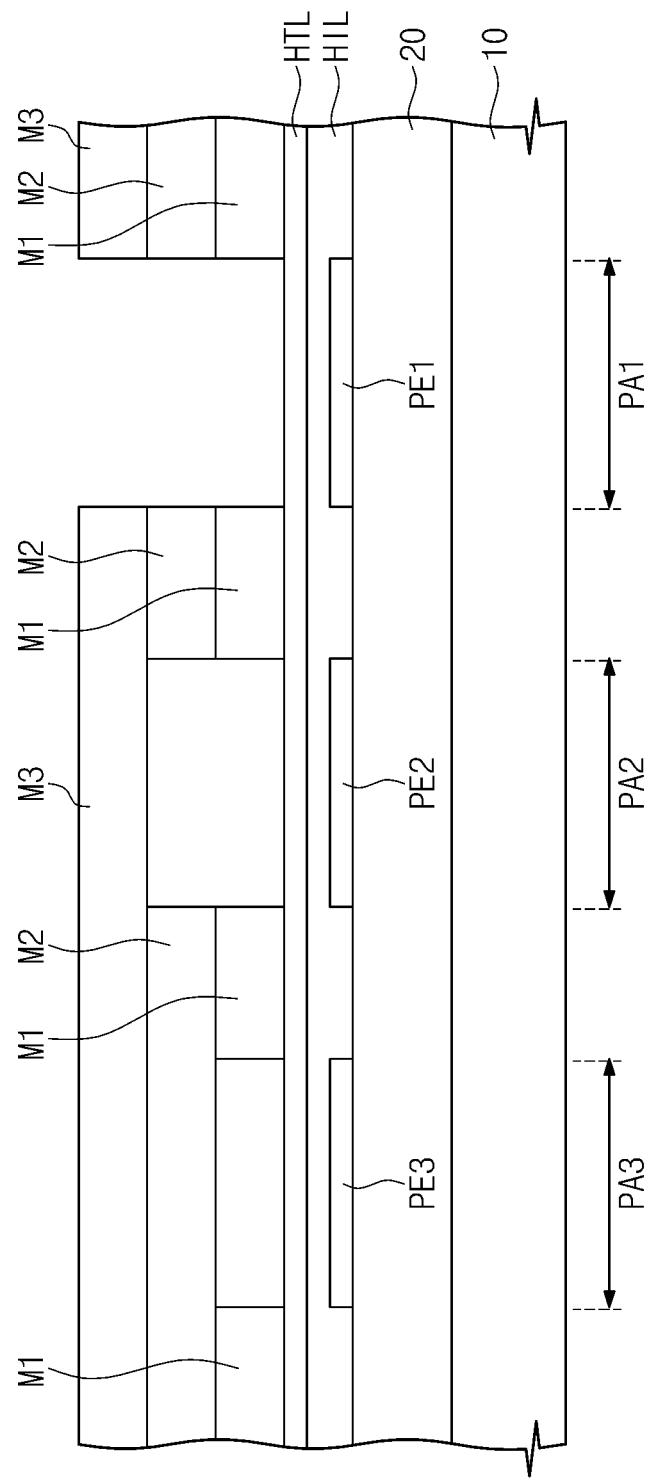

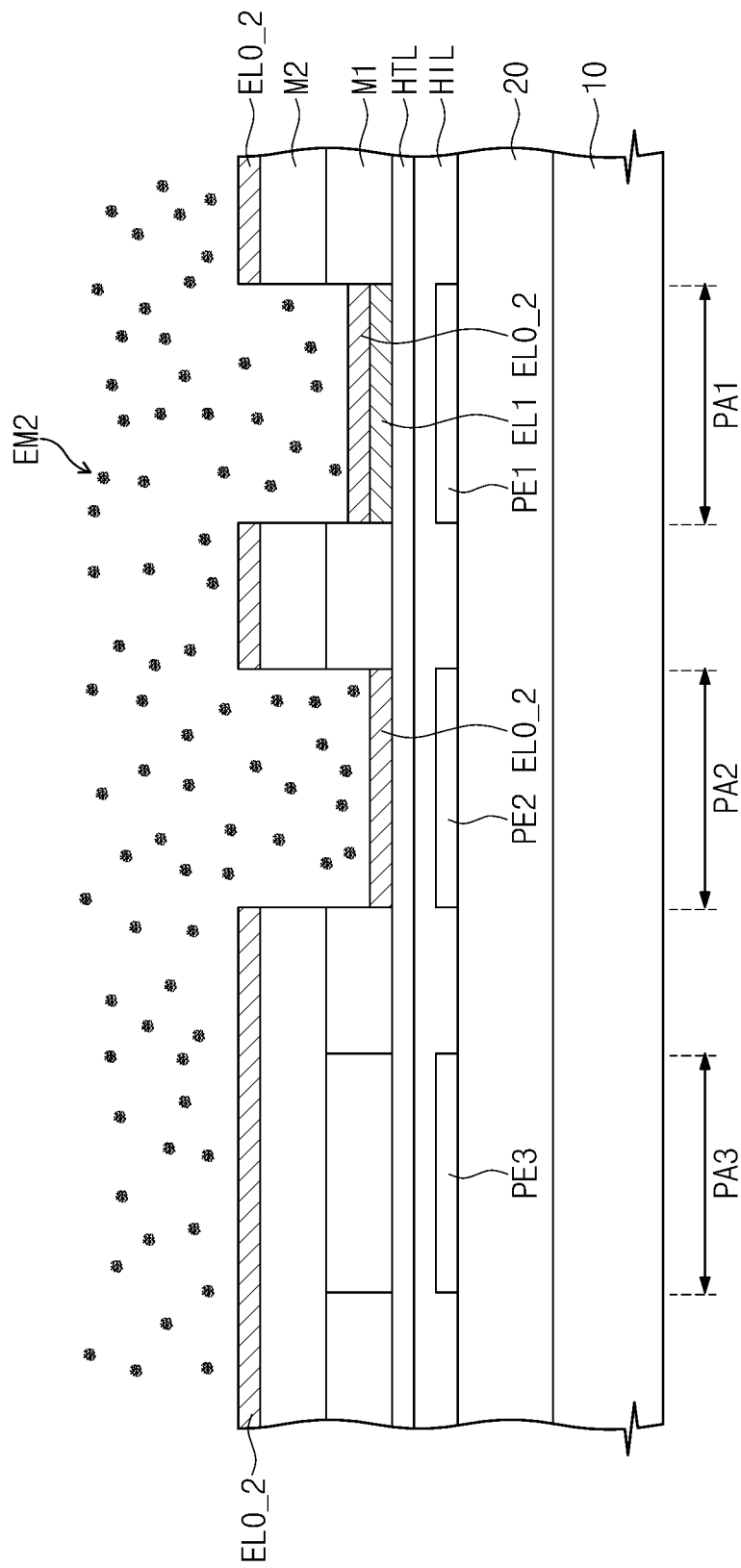

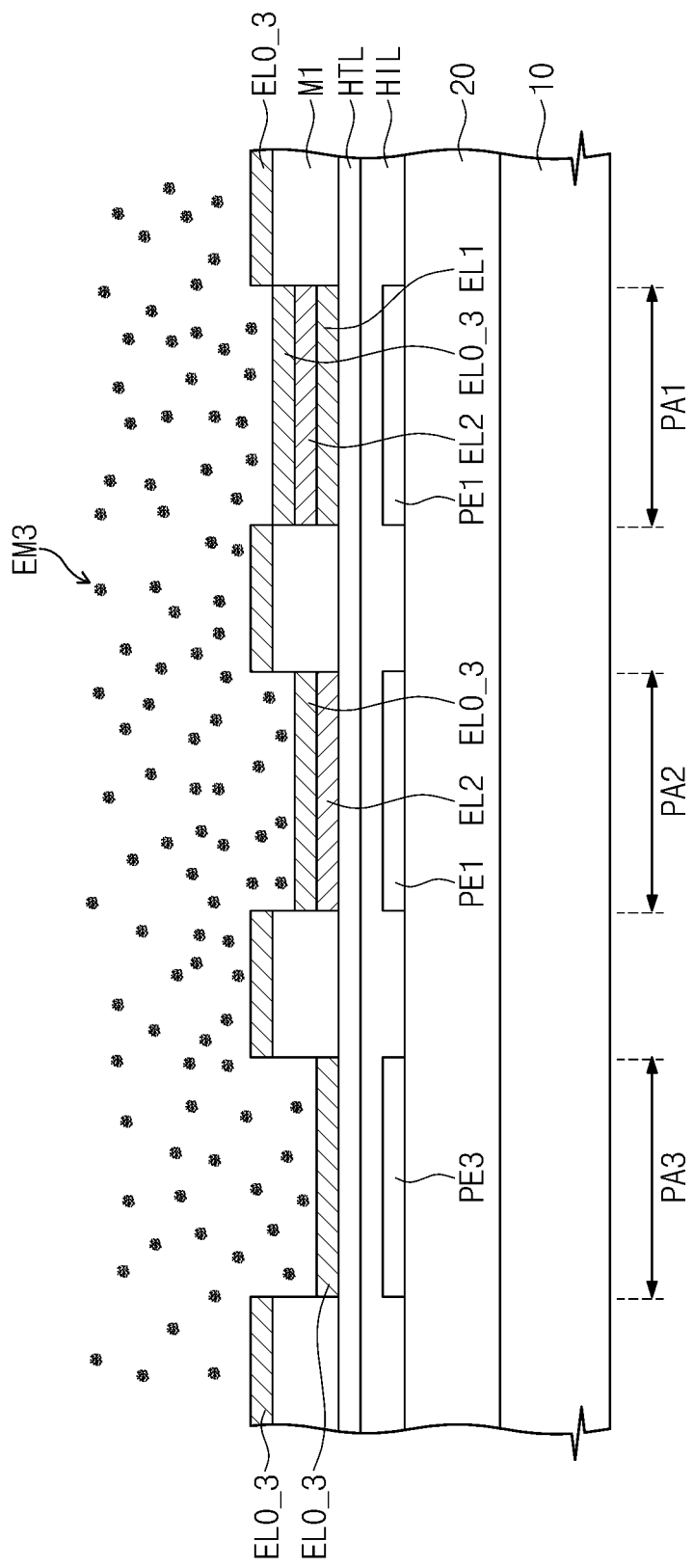

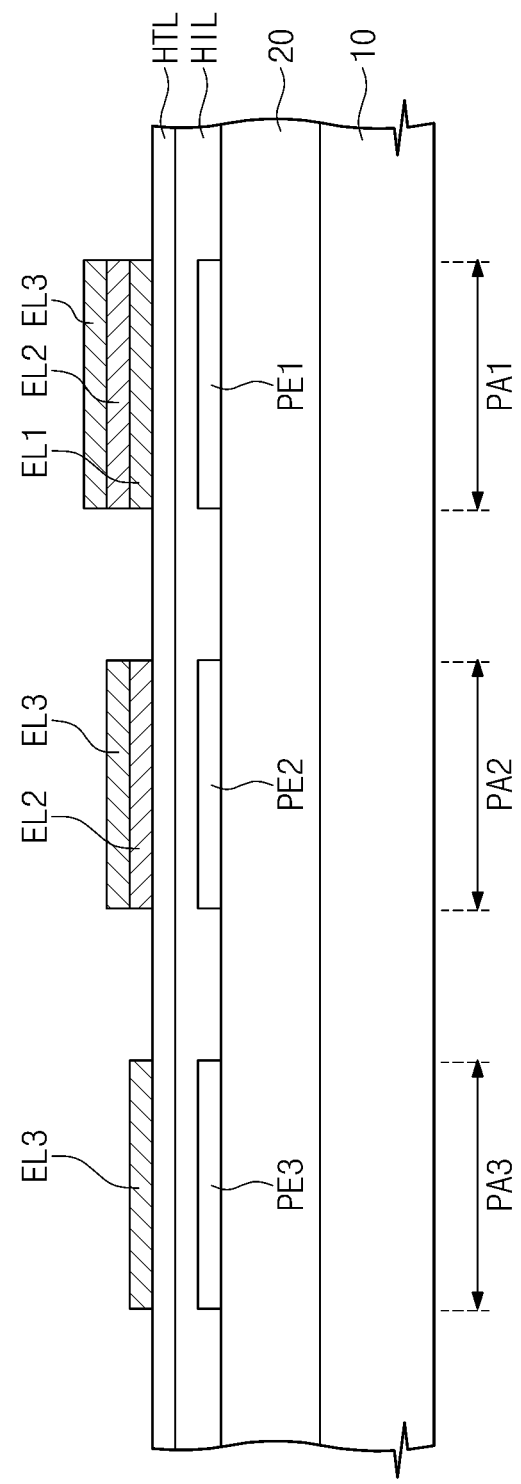

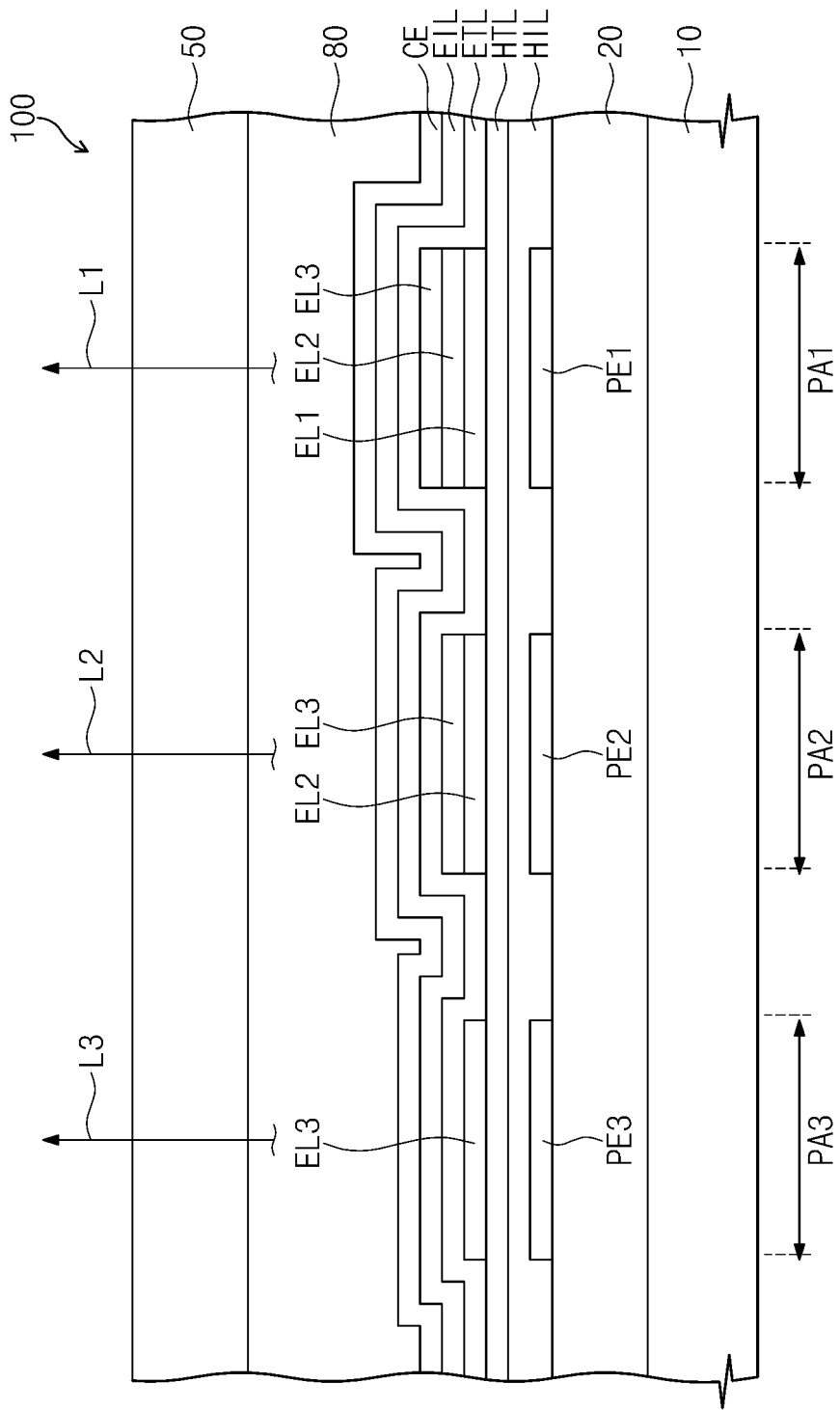

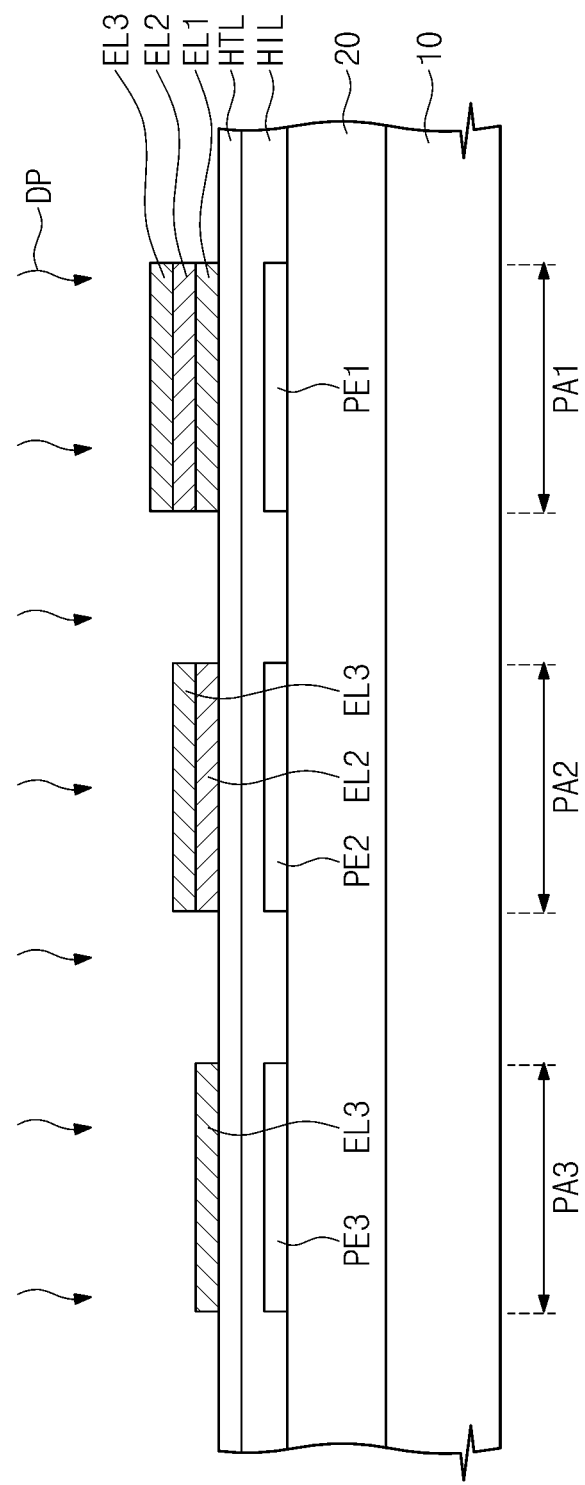

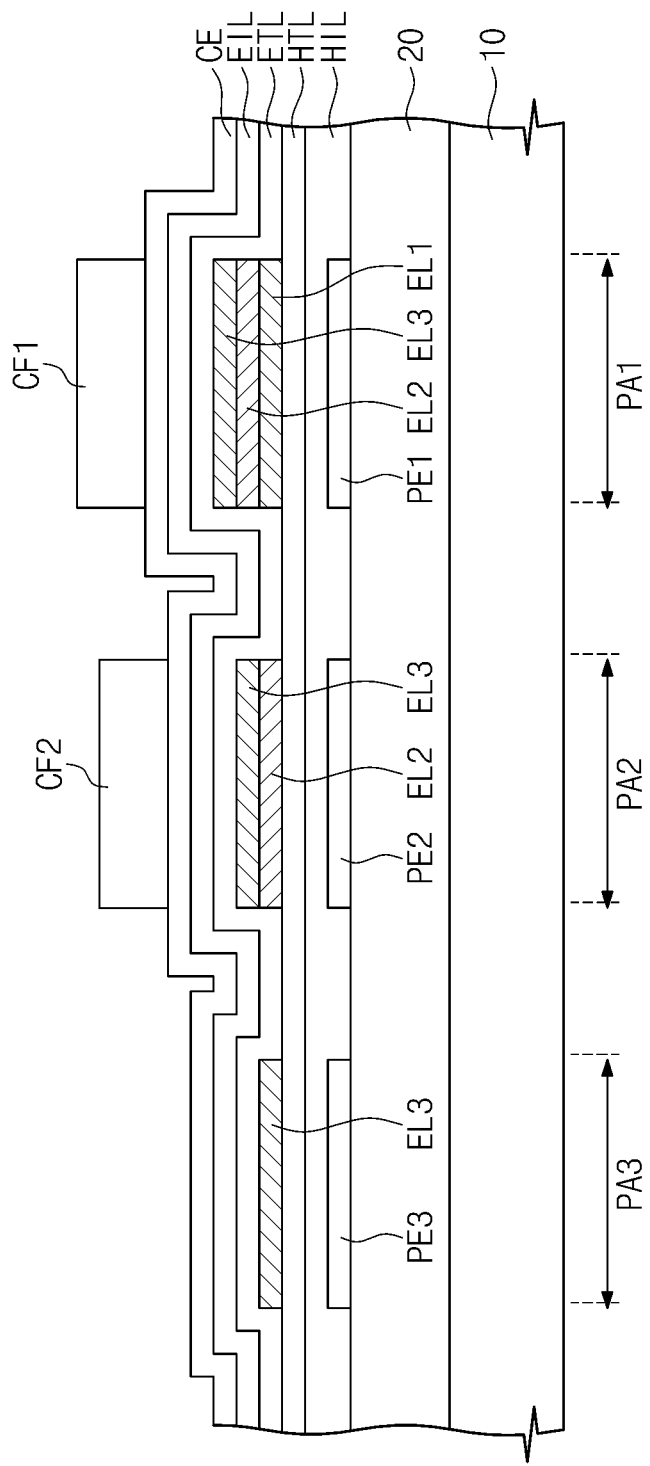

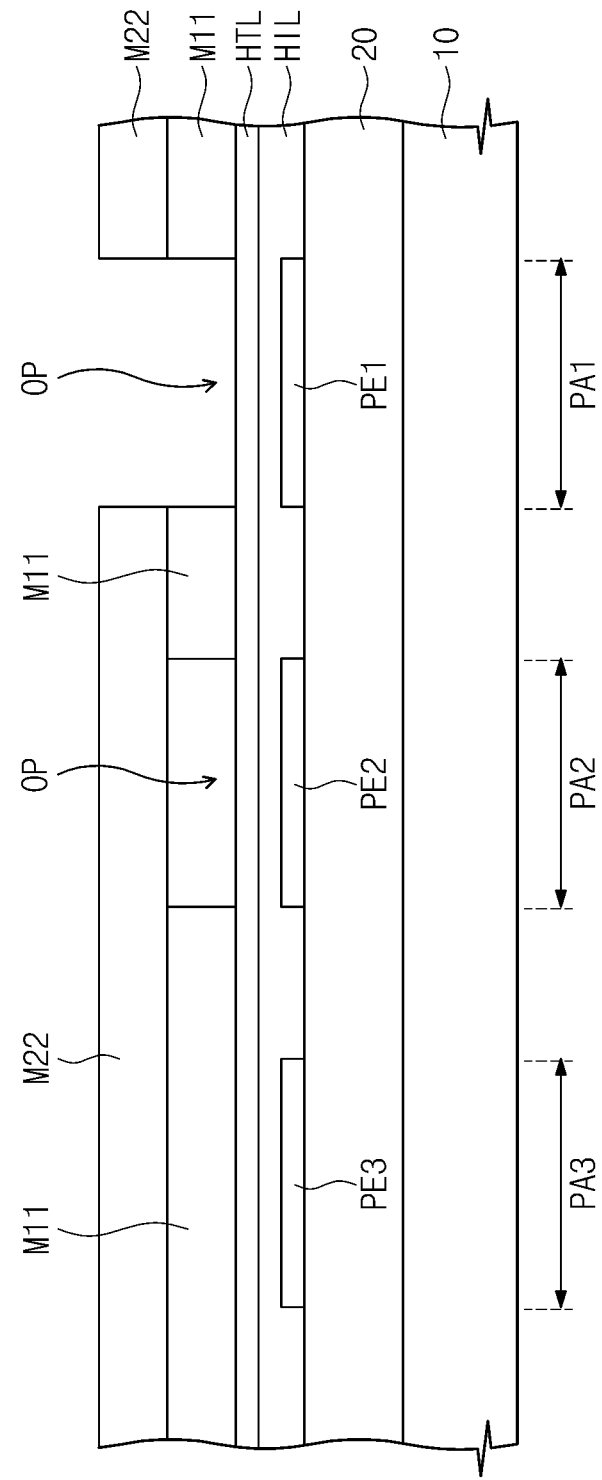

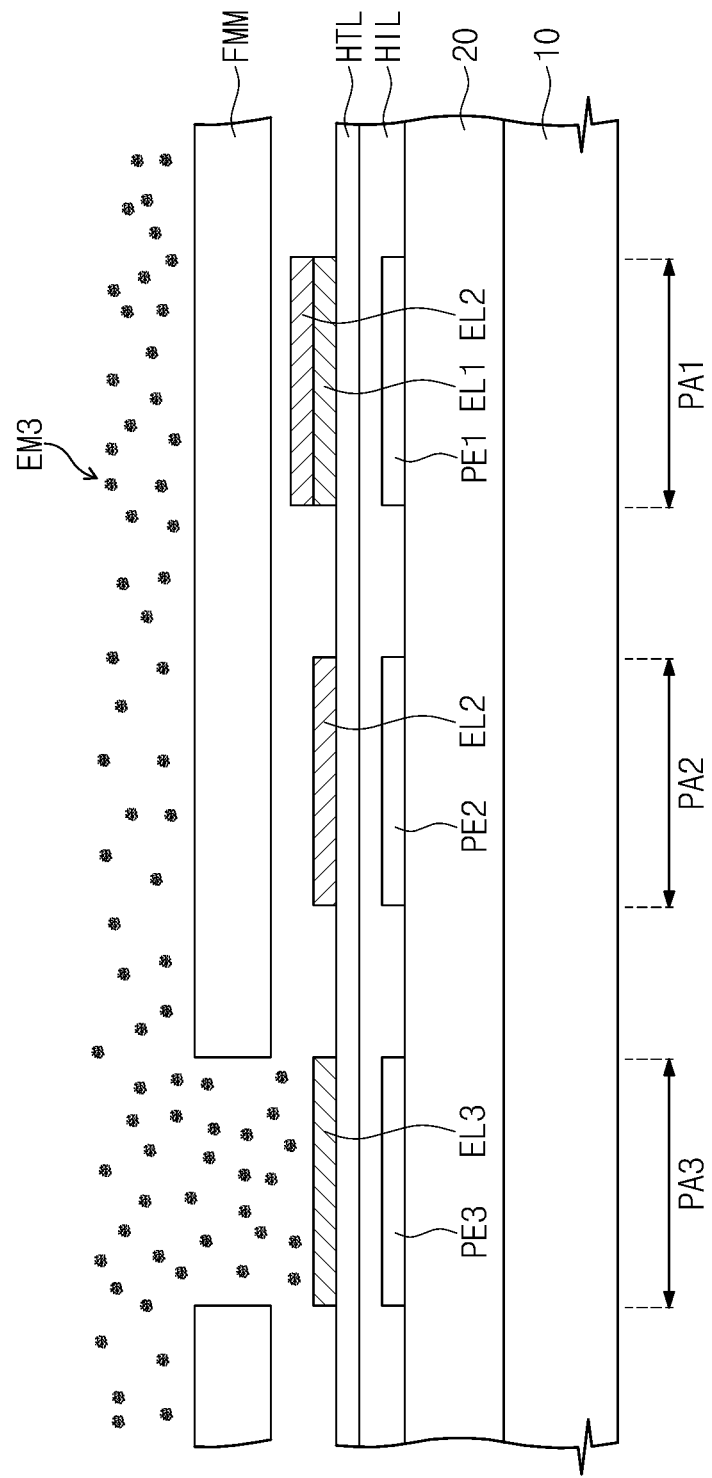

METHOD OF MANUFACTURING ORGANIC ELECTROLUMINESCENT DISPLAY

CROSS-REFERENCE TO RELATED APPLICATIONS

This U.S. non-provisional patent application claims priority under 35 U.S.C. §119 of Korean Patent Application No. 10-2012-0104128, filed on Sep. 19, 2012, the contents of which are hereby incorporated by reference.

BACKGROUND

1. Field

The present disclosure relates to a method of manufacturing an organic electroluminescent display. More particularly, the present disclosure relates to a method of manufacturing an organic light emitting layer of the organic electroluminescent display.

2. Description of the Related Technology

In recent years, organic electroluminescent displays have been spotlighted as a next generation display device since it has superior brightness and viewing angle and does not need to include a separate light source when compared to a liquid crystal display device. Accordingly, the organic electroluminescent display has advantages of slimness and lightweightedness. In addition, the organic electroluminescent display has properties, such as for example fast response speed, low driving voltage, high brightness, etc.

In general, the organic electroluminescent display includes an anode electrode, a cathode, a hole injection layer, a hole transfer layer, an organic light emitting layer, an electron transfer layer, and an electron injection layer. Holes and electrons are injected into the organic emitting layer through the anode electrode and the cathode electrode, and are recombined in the organic light emitting layer to generate excitons (electron-hole pairs). The excitons emit energy, which is discharged when an excited state returns to a ground state, as light.

Meanwhile, among various processes applied to manufacture a liquid crystal display, a portion of the processes for the liquid crystal display is applied to manufacture the organic electroluminescent display. However, a portion of the processes, e.g., a process of patterning the organic light emitting layer on a substrate is not common and not used frequently, it is still being researched.

SUMMARY OF CERTAIN INVENTIVE ASPECTS

The present disclosure provides a method of manufacturing an organic electroluminescent display, capable of easily patterning an organic light emitting layer.

Embodiments of the inventive concept provide a method of manufacturing an organic electroluminescent display is provided as follows. When a substrate including a first pixel area and a second pixel area spaced apart from the first pixel area is prepared, a first mask including openings formed therethrough is disposed on the substrate to respectively correspond to the first and second pixel areas, and a second mask including an opening formed therethrough corresponding to the first pixel area is disposed on the first mask to expose the first pixel area and cover the second pixel area.

Then, a first organic light emitting material is provided to the substrate to form the first organic light emitting material in the exposed first pixel area and the second mask is removed from the substrate to expose the first and second pixel areas. After that, a second organic light emitting material is provided to the substrate to form the second light emitting material in the exposed first and second pixel areas and the first mask is removed from the substrate.

Embodiments of the inventive concept provide a method of manufacturing an organic electroluminescent display is provided as follows. When a substrate including first, second, and third pixel areas spaced apart from each other is prepared, a first mask including openings formed therethrough is disposed on the substrate to respectively correspond to the first, second, and third pixel areas, a second mask including openings formed therethrough is disposed on the first mask to respectively correspond to the first and second pixel areas, and a third mask including an opening formed therethrough corresponding to the first pixel area is disposed on the second mask to expose the first pixel area and cover the second and third pixel areas.

Then, a first organic light emitting material is provided to the substrate to form the first organic light emitting material in the exposed first pixel area and the third mask is removed from the substrate to expose the first and second pixel areas. Next, a second organic light emitting material is provided to the substrate to form the second light emitting material in the exposed first and second pixel areas, and the second mask is removed from the substrate to expose the first, second, and third pixel areas. After that, a third organic light emitting material is provided to the substrate to form the third light emitting material in the exposed first, second, and third pixel areas, and the first mask is removed from the substrate.

According to the above, the organic light emitting layers different from each other are selectively formed in the pixel areas using the masks each having the film shape. Thus, the number of usage of the metal masks used to pattern the organic light emitting layers may be reduced, or the metal masks may be replaced with the masks having the film shape. As a result, process defects caused by using the meal mask, e.g., sagging of the metal mask by the weight thereof, may be prevented, and thus the mask may be scale up.

BRIEF DESCRIPTION OF THE DRAWINGS

The above and other advantages of the present invention will become readily apparent by reference to the following detailed description when considered in conjunction with the accompanying drawings wherein:

FIGS. 1A to 1J are cross-sectional views showing a method of an organic electroluminescent display according to an embodiment of the present invention;

FIG. 2 is a cross-sectional view showing a method of manufacturing an organic electroluminescent display according to another embodiment of the present invention;

FIG. 3 is a cross-sectional view showing a method of manufacturing an organic electroluminescent display according to another embodiment of the present invention; and FIGS. 4A to 4F are cross-sectional views showing a method of manufacturing an organic electroluminescent display according to another embodiment of the present invention.

DETAILED DESCRIPTION OF CERTAIN INVENTIVE EMBODIMENTS

Figure 1B:
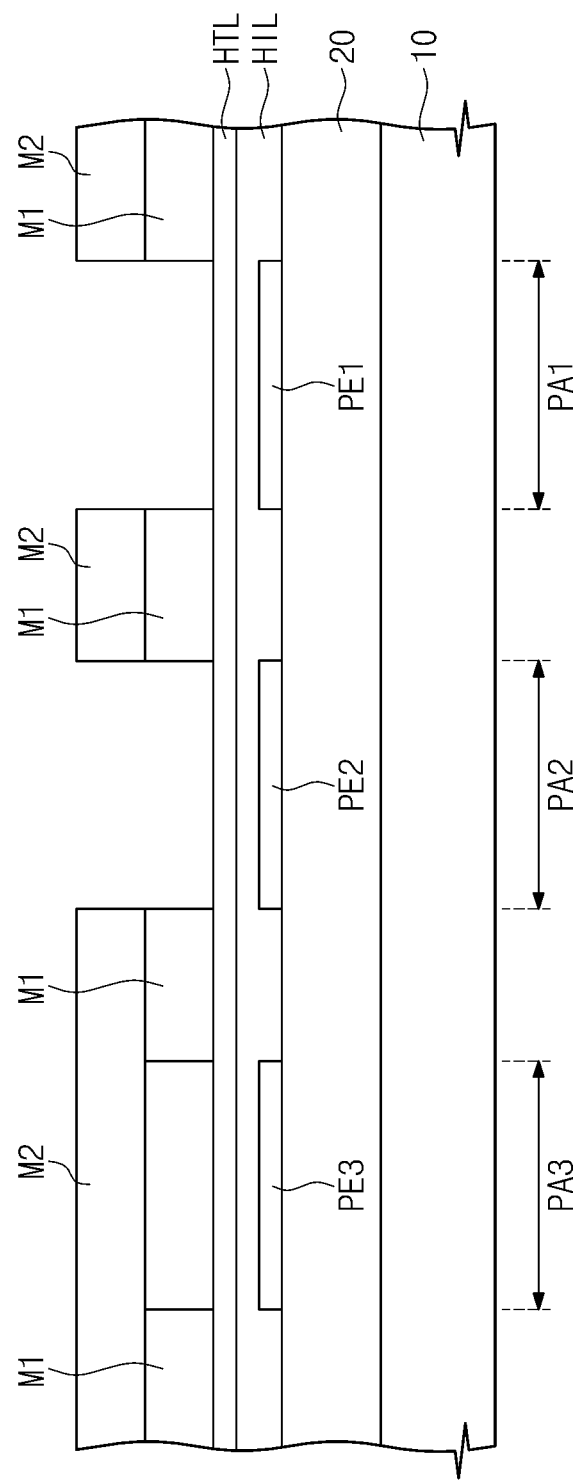

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers generally refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIGS. 1A to 1J are cross-sectional views showing a method of an organic electroluminescent display according to an embodiment of the present invention.

Referring to FIG. 1A, a substrate 10 includes a plurality of first pixel areas PA1, a plurality of second pixel areas PA2, and a plurality of third pixel areas PA3. When manufacturing processes for the organic electroluminescent display are performed, pixels, from which a first light L1 (refer to FIG. 1J) exits, are respectively formed in the first pixel areas PA1, pixels, from which a second light L2 (refer to FIG. 1J) having a different color from that of the first light L1 exits, are respectively formed in the second pixel areas PA2, and pixels, from which a third light L3 (refer to FIG. 1J) having a different color from those of the first and second lights L1 and L2 exits, are respectively formed in the third pixel areas PA3.

FIGS. 1A to 1J show the manufacturing method of the pixels respectively disposed in first, second, and third pixel areas PA1, PA2, and PA3 as a representative example.

An organic layer 20 is formed on the substrate 10 and first, second, and third pixel electrodes PE1, PE2, and PE3 are disposed on the organic layer 20 to correspond to the first, second, and third pixel areas PA1, PA2, and PA3 in a one-to-one correspondence.

In one embodiment, the organic layer 20 covers a plurality of driving transistors (not shown) disposed on the substrate 10. The driving transistors include first, second, and third driving transistors electrically connected to the first, second, and third pixel electrodes PE1, PE2, and PE3 in a one-to-one correspondence to switch driving signals applied to the first, second, and third pixel electrodes PE1, PE2, and PE3.

In addition, each driving transistor includes a gate electrode, a source electrode, an active pattern, and a drain electrode. Accordingly, a gate insulating layer (not shown) is further disposed on the substrate 10 to insulate the gate electrode from other conductive patterns and an inter-insulating layer (not shown) is further disposed on the substrate 10 to insulate the source and drain electrodes from other conductive patterns.

After the first, second, and third pixel electrodes PE1, PE2, and PE3 are formed, a hole injection layer HIL and a hole transfer layer HTL are sequentially formed on the first to third pixel electrodes PE1 to PE3. In one embodiment, each of the hole injection layer HIL and the hole transfer layer HTL has a single-layer structure to be commonly formed over the first to third pixel areas PA1 to PA3. According to another embodiment, one of the hole injection layer HIL and the hole transfer layer HTL has the single-layer structure to be commonly formed over the first to third pixel areas PA1 to PA3, or each of the hole injection layer HIL and the hole transfer layer HTL is patterned to be formed in each of the first to third pixel areas PA1 to PA3.

After the hole injection layer HIL and the hole transfer layer HTL are formed, a first mask M1 is disposed on the substrate 10. The first mask M1 includes openings formed therethrough corresponding to the first to third pixel areas PA1 to PA3 so as to expose the first to third pixel areas PA1 to PA3. When the first mask M1 having the above-mentioned structure is disposed on the substrate 10, the hole transfer layer HTL is partially exposed in the first to third pixel areas PA1 to PA3.

In one embodiment, the first mask M1 has a film shape through which the openings are formed. In this case, the openings of the first mask M1 are aligned with the first to third pixel areas PA1 to PA3 and the first mask M1 is disposed on a thin layer disposed at an uppermost position among thin layers on the substrate 10.

Referring to FIG. 1B, a second mask M2 is disposed on the first mask M1 after the first mask M1 is disposed on the substrate 10. The second mask M2 includes openings formed therethrough corresponding to the first and second pixel areas PA1 and PA2 to expose the first and second pixel areas PA1 and PA2. In addition, different from the first mask M1, since a portion of the second mask M2 is not opened in an area corresponding to the third pixel area PA3, the third pixel area PA3 is covered by the second mask M2.

In one embodiment, similar to that of the first mask M1, the second mask M2 has the film shape through which the openings are formed. In this case, the second mask M2 is adhered on the first mask M1.

Referring to FIG. 1C, a third mask M3 is disposed on the second mask M2 after the second mask M2 is disposed on the first mask M1. The third mask M3 includes an opening formed therethrough corresponding to the first pixel area PA1 to expose the first pixel area PA1. In addition, different from the first and second masks M1 and M2, since portions of the third mask M3 are not opened in areas corresponding to the second and third pixel areas PA2 and PA3, the second and third pixel areas PA2 and PA3 are covered by the third mask M3.

In one embodiment, similar to those of the first and second masks M1 and M2, the third mask M3 has the film shape through which the opening is formed. In this case, the third mask M3 is adhered on the second mask M2.

Figure 1D:
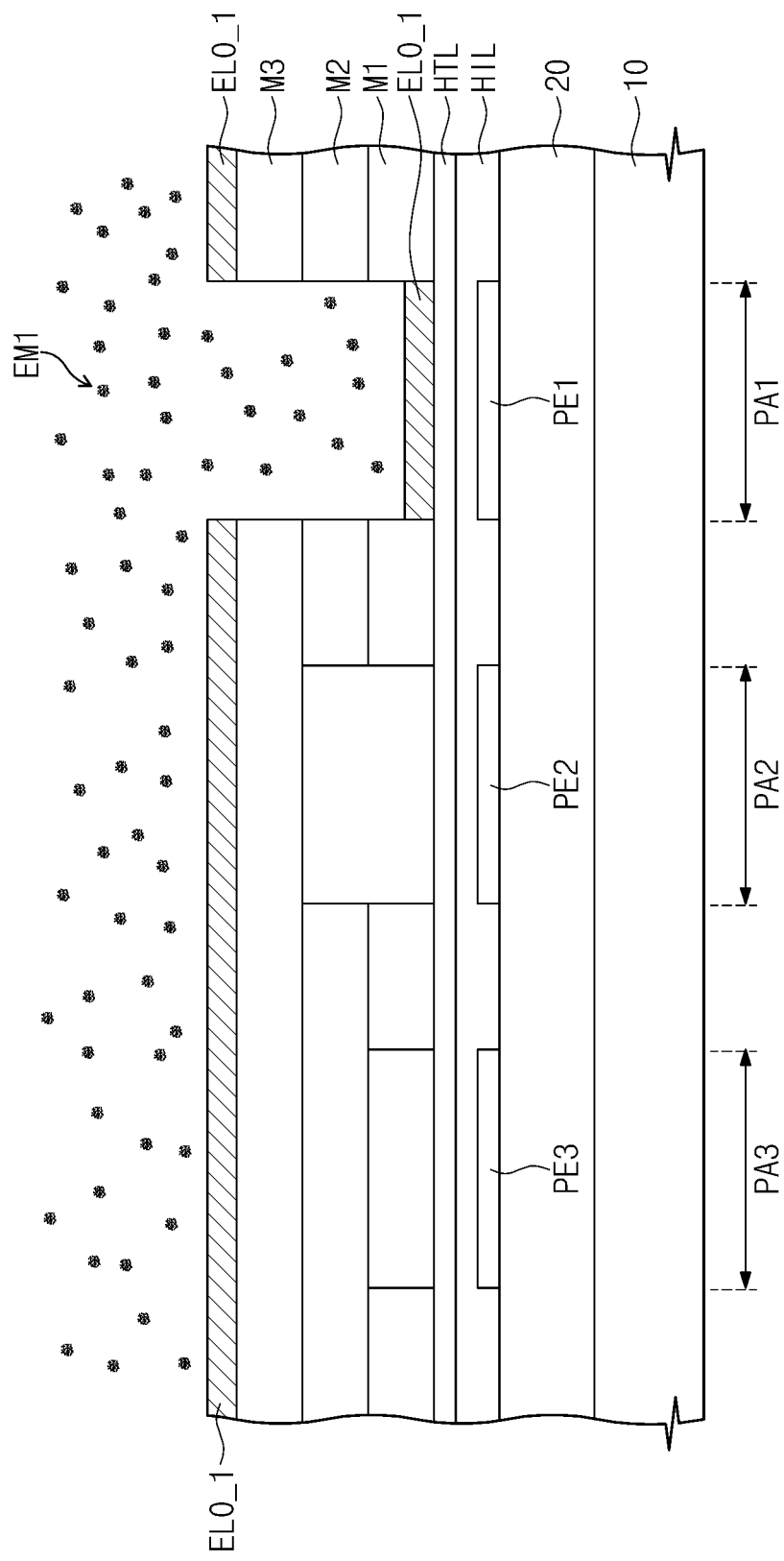
Figure 1E:
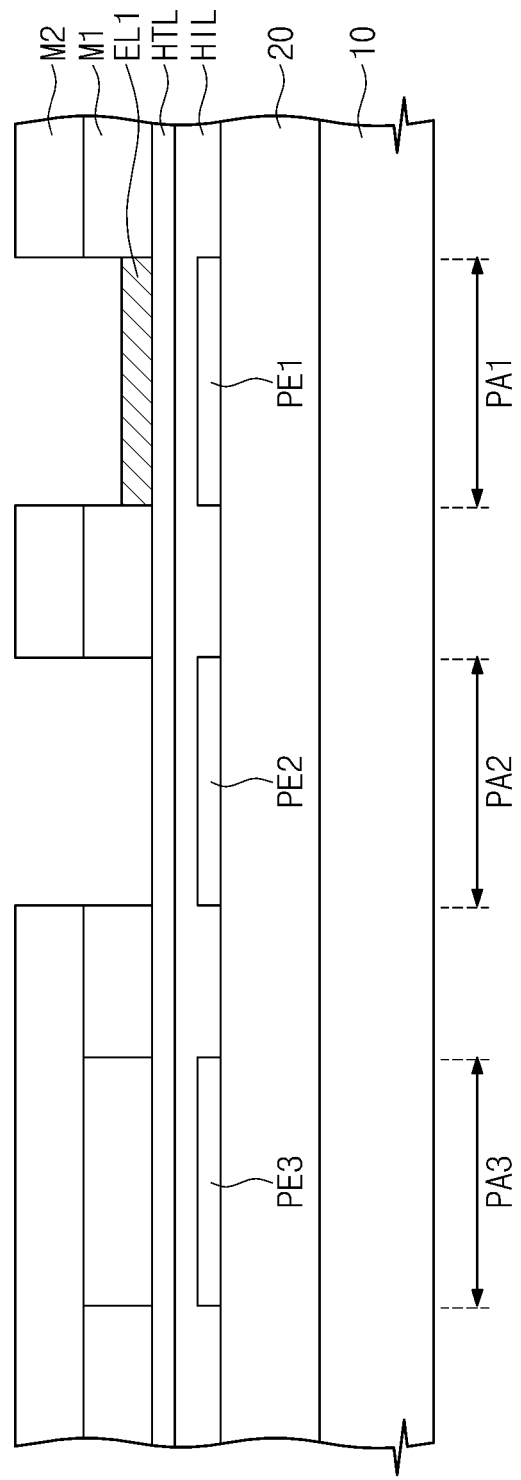

Referring to FIGS. 1D and 1E, after the first, second, and third masks M1, M2, and M3 are sequentially disposed on the substrate 10, a first organic light emitting material EM1 is provided to the substrate 10. As a result, the first organic light emitting material EM1 is deposited on the hole transfer layer HTL in the first pixel area PA1 and is deposited on the third mask M3 in the other area except for the first pixel area PA1. Accordingly, a first preliminary organic light emitting layer ELO_1 is formed on the third mask M3.

In one embodiment, the first organic light emitting material EM1 may be provided to the substrate 10 by using an evaporation method. Generally, the evaporation method is performed by heating and evaporating an organic light emitting material to deposit the evaporated organic light emitting material on a substrate. Thus, in the case that the evaporation method is used to provide the first organic light emitting material EM1 to the substrate 10, an evaporation apparatus that evaporates a source material of the first organic light emitting material EM1 is disposed under the substrate 10 and the substrate 10 is disposed above the evaporation apparatus to allow the third mask M3 to face the evaporation apparatus.

Then, the third mask M3 is removed from the substrate 10. As a result, the first preliminary organic light emitting layer ELO_1 formed on the third mask M3 is removed from the substrate 10 together with the third mask M3, and the first preliminary organic light emitting layer ELO_1 formed on the hole transfer layer HTL remains as a first organic light emitting layer EL1.

Figure 1G:
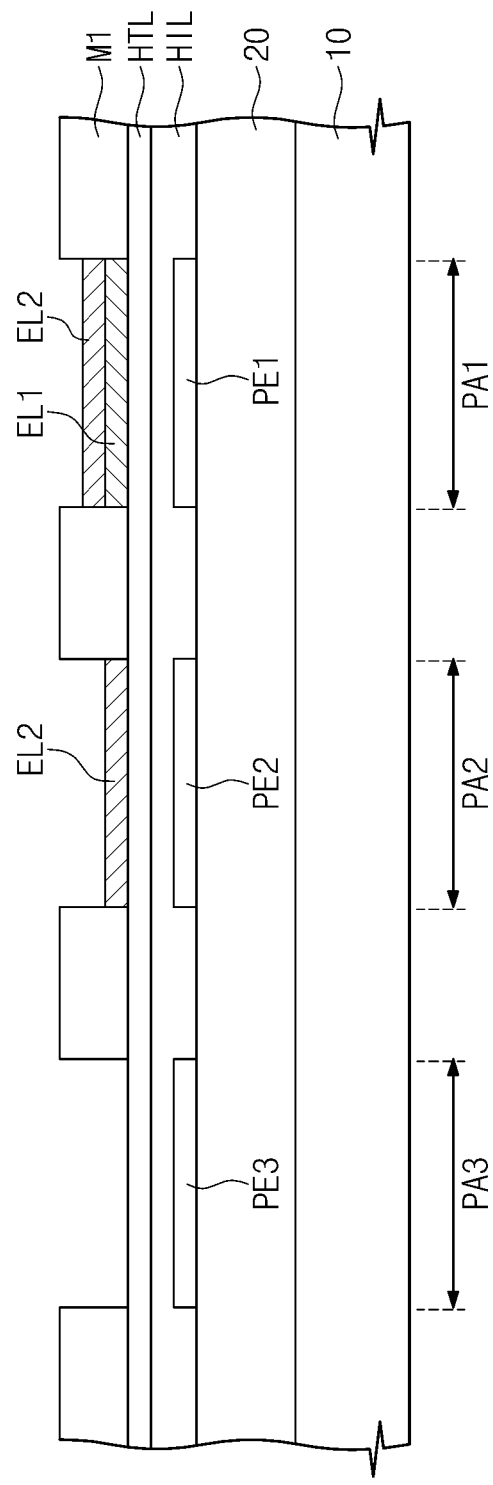

Referring to FIGS. 1F and 1G, after the first organic light emitting layer EL1 is formed, a second organic light emitting material EM2 is provided to the substrate 10. As a result, the second organic light emitting material EM2 is deposited on the first organic light emitting layer EL1 in the first pixel area PA1 and deposited on the hole transfer layer HTL in the second pixel area PA2. In addition, the second organic light emitting material EM2 is deposited on the second mask M2 in the other area except for the first and second pixel areas PA1 and PA2. Accordingly, a second preliminary organic light emitting layer ELO_2 is formed on the second mask M2.

Then, the second mask M2 is removed from the substrate 10 after the second preliminary organic light emitting layer ELO_2 is formed. As a result, the second preliminary organic light emitting layer ELO_2 formed on the second mask M2 is removed from the substrate 10 together with the second mask M2, and the second preliminary organic light emitting layer ELO_2 formed on the hole transfer layer HTL in the second pixel area PA2 and on the first organic light emitting layer EL1 in the first pixel area PA1 remains as a second organic light emitting layer EL2.

Referring to FIGS. 1H and 1I, after the second organic light emitting layer EL2 is formed, a third organic light emitting material EM3 is provided to the substrate 10. As a result, the third organic light emitting material EM3 is deposited on the second organic light emitting layer EL2 in the first pixel area PA1, deposited on the second organic light emitting layer EL2 in the second pixel area PA2, and deposited on the hole transfer layer HTL in the third pixel area PA3. In addition, the third organic light emitting material EM3 is deposited on the first mask M1 in the other area except for the first, second, and third pixel areas PA1, PA2, and PA3. Accordingly, a third preliminary organic light emitting layer ELO_3 is formed on the first mask M1.

Then, the first mask M1 is removed from the substrate 10 after the third preliminary organic light emitting layer ELO_3 is formed. As a result, the third preliminary organic light emitting layer ELO_3 formed on the first mask M1 is removed from the substrate 10 together with the first mask M1, and the third preliminary organic light emitting layer ELO_3 formed on the hole transfer layer HTL in the third pixel area PA3, on the second organic light emitting layer EL2 in the second pixel area PA2, and on the second organic light emitting layer EL2 in the first pixel area PA1 remains as a third organic light emitting layer EL3.

Referring to FIG. 1J, after the third organic light emitting layer EL3 is formed, an electron transfer layer ETL, an electron injection layer EIL, and a common electrode CE are sequentially formed.

In one embodiment, each of the electron transfer layer ETL, the electron injection layer EIL, and the common electrode CE has a single-layer structure to be formed over the first, second, and third pixel areas PA1, PA2, and PA3. According to another embodiment, one of the electron injection layer EIL and the electron transfer layer ETL has the single-layer structure to be commonly formed over the first, second, and third pixel areas PA1, PA2, and PA3, or each of the electron injection layer EIL and the electron transfer layer ETL is patterned to be formed in each of the first, second, and third pixel areas PA1, PA2, and PA3.

Then, a sealing substrate 50 is coupled to the substrate 10 to cover the thin layers formed on the substrate 10, and a filling layer 80 is arranged between the substrate 10 and the sealing substrate 50, thereby manufacturing the organic electroluminescent display 100. In the organic electroluminescent display 100, the first light L1 generated by the first, second, and third light emitting layers EL1, EL2, and EL3 exits from the first pixel area PA1, the second light L2 generated by the second and third light emitting layers EL2 and EL3 exits from the second pixel area PA2, and the third light L3 generated by the third light emitting layer EL3 exits from the third pixel area PA3.

In one embodiment, the first to third lights L1 to L3 may have different colors. For example, the first, second, and third lights L1, L2, and L3 may be the blue, green, and red lights, respectively.

As described above, two or more different organic light emitting layers are formed in at least one of the first, second, and third pixel areas PA1, PA2, and PA3, and one or more lights of the first, second, and third lights L1, L2, and L3 are generated by using two or more different organic light emitting layers stacked one on another. Thus, the colors of the lights generated by using two or more different organic light emitting layers stacked one on another are required to be precisely controlled in order to improve a color reproducibility of the organic electroluminescent display 100. To this end, processes of precisely controlling the colors of the lights will be described in detail with reference to FIGS. 2 and 3.

FIG. 2 is a cross-sectional view showing a method of manufacturing an organic electroluminescent display according to another embodiment of the present invention. In detail, the manufacturing process of the organic electroluminescent display shown in FIG. 2 is to control the colors of the lights exiting from the first, second, and third pixel areas PA1, PA2, and PA3 after the processes described with reference to FIGS.

1A to 1I are performed. In FIG. 2, accordingly, the same reference numerals denote the same elements in FIGS. 1A to 1I, and thus detailed descriptions of the same elements will be omitted.

Referring to FIG. 2, when the first, second, and third organic light emitting layers EL1, EL2, and EL3 are selectively formed in the first, second, and third pixel areas PA1, PA2, and PA3, dopants DP are provided to the substrate 10 to control the color of at least one of the first, second, and third lights L1, L2, and L3.

The dopants DP include at least one of a fluorescent material or a phosphor material. Therefore, the dopants DP absorb the light generated by at least one of the first, second, and third light organic light emitting layers EL1, EL2, and EL3 and generate a light having a different color from the light, and thus the color of at least one of the first, second, and third lights L1, L2, and L3 may be easily controlled by controlling the kind and content of the dopants DP.

In addition, in the embodiment shown in FIG. 2, the dopants DP are provided to the substrate 10 after the third organic light emitting layer EL3 is formed. However, different dopants from the dopants DP may be provided to the substrate 10 before the third organic light emitting layer EL3 is formed, or different dopants from the dopants DP may be provided to the substrate 10 before the second organic light emitting layer EL2 is formed.

FIG. 3 is a cross-sectional view showing a method of manufacturing an organic electroluminescent display according to another embodiment of the present invention. In detail, the manufacturing process of the organic electroluminescent display shown in FIG. 3 is to control the colors of the lights exiting from the first, second, and third pixel areas PA1, PA2, and PA3 after the processes described with reference to FIGS. 1A to 1L are performed. In FIG. 3, accordingly, the same reference numerals denote the same elements in FIGS. 1A to 1L, and thus detailed descriptions of the same elements will be omitted.

Referring to FIG. 3, when the first, second, and third organic light emitting layers EL1, EL2, and EL3 are selectively formed in the first, second, and third pixel areas PA1, PA2, and PA3, the electron transfer layer ETL, the electron injection layer EIL, and the common electrode CE are sequentially formed on the substrate 10.

Then, color filters are formed on the common electrode CE. The color filters include a first color filter CF1 formed in the first pixel area PA1 and a second color filter CF2 formed in the second pixel area PA2. In this case, the first light L1 (refer to FIG. 1J) exiting from the first pixel area PA1 is filtered while passing through the first color filter CF1, and thus the first light L1 may have a predetermined color. In addition, the second light L2 (refer to FIG. 1J) exiting from the second pixel area PA2 is filtered while passing through the second color filter CF2, and thus the second light L2 may have a predetermined color.

Accordingly, although two or more different organic light emitting layers are formed in the first and second pixel areas PA1 and PA2 and the lights are generated by the organic light emitting layers stacked one on another in each of the first and second pixel areas PA1 and PA2, the colors of the lights may be easily controlled by the first and second color filters CF1 and CF2.

FIGS. 4A to 4F are cross-sectional views showing a method of manufacturing an organic electroluminescent display according to another embodiment of the present invention. In FIGS. 4A to 4F, the same reference numerals denote the same elements in FIGS. 1A to 1J, and thus detailed descriptions of the same elements will be omitted.

Referring to FIG. 4A, an organic layer 20, first, second, and third pixel electrodes PE1, PE2, and PE3, a hole injection layer HIL, and a hole transfer layer HTL are sequentially formed on a substrate 10. Then, a first mask M11 is formed on the hole transfer layer HTL. The first mask M11 includes openings OP formed therethrough to respectively correspond to the first and second pixel areas PA1 and PA2.

Then, a second mask M22 is formed on the first mask M11. The second mask M22 includes an opening OP formed therethrough to correspond to the first pixel area PA1. Accordingly, the first pixel area PA1 is exposed through the openings OP formed penetrating through the first and second masks M11 and M22, and the second pixel area PA2 is covered by the second mask M22.

Figure 4B:
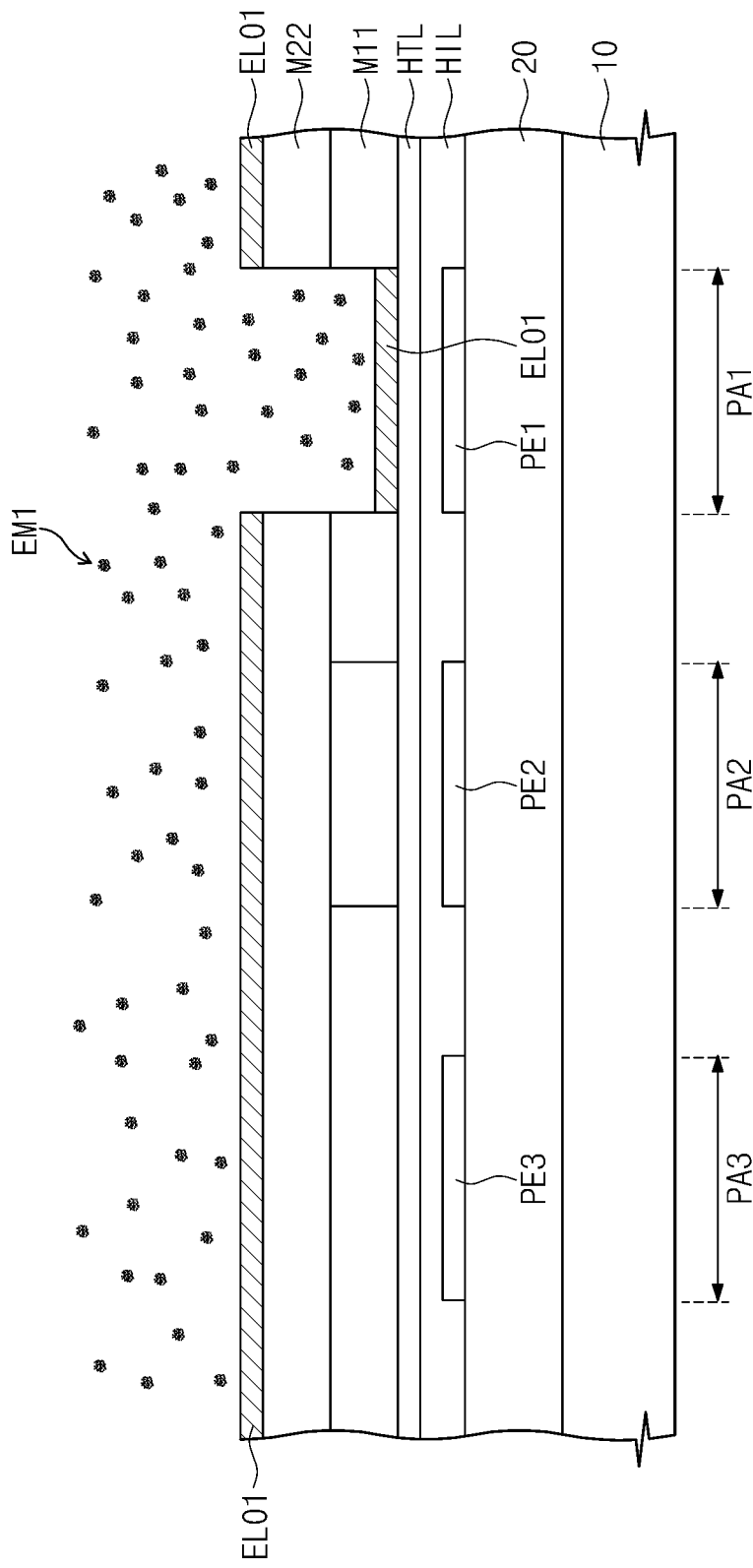
Figure 4C:
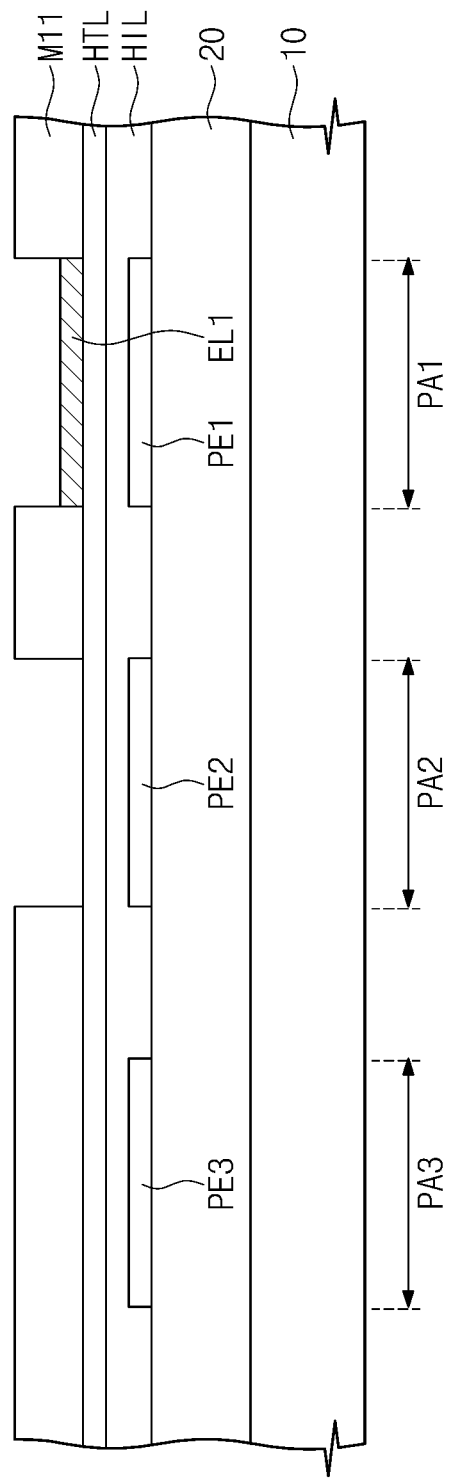

Referring to FIGS. 4B and 4C, after the first and second masks M11 and M22 are disposed on the substrate 10, a first organic light emitting material EM1 is provided to the substrate 10. As a result, the first organic light emitting material EM1 is deposited on the hole transfer layer HTL in the first pixel area PA1 and deposited on the second mask M22 in the other area except for the first pixel area PA1. Accordingly, a first preliminary organic light emitting layer ELO1 is formed on the second mask M22.

Then, the second mask M22 is removed from the substrate 10. As a result, the first preliminary organic light emitting layer ELO1 formed on the second mask M22 is removed from the substrate 10 together with the second mask M22, and the first preliminary organic light emitting layer ELO1 formed on the hole transfer layer HTL in the first pixel area PA1 remains as a first organic light emitting layer EL1.

Figure 4D:
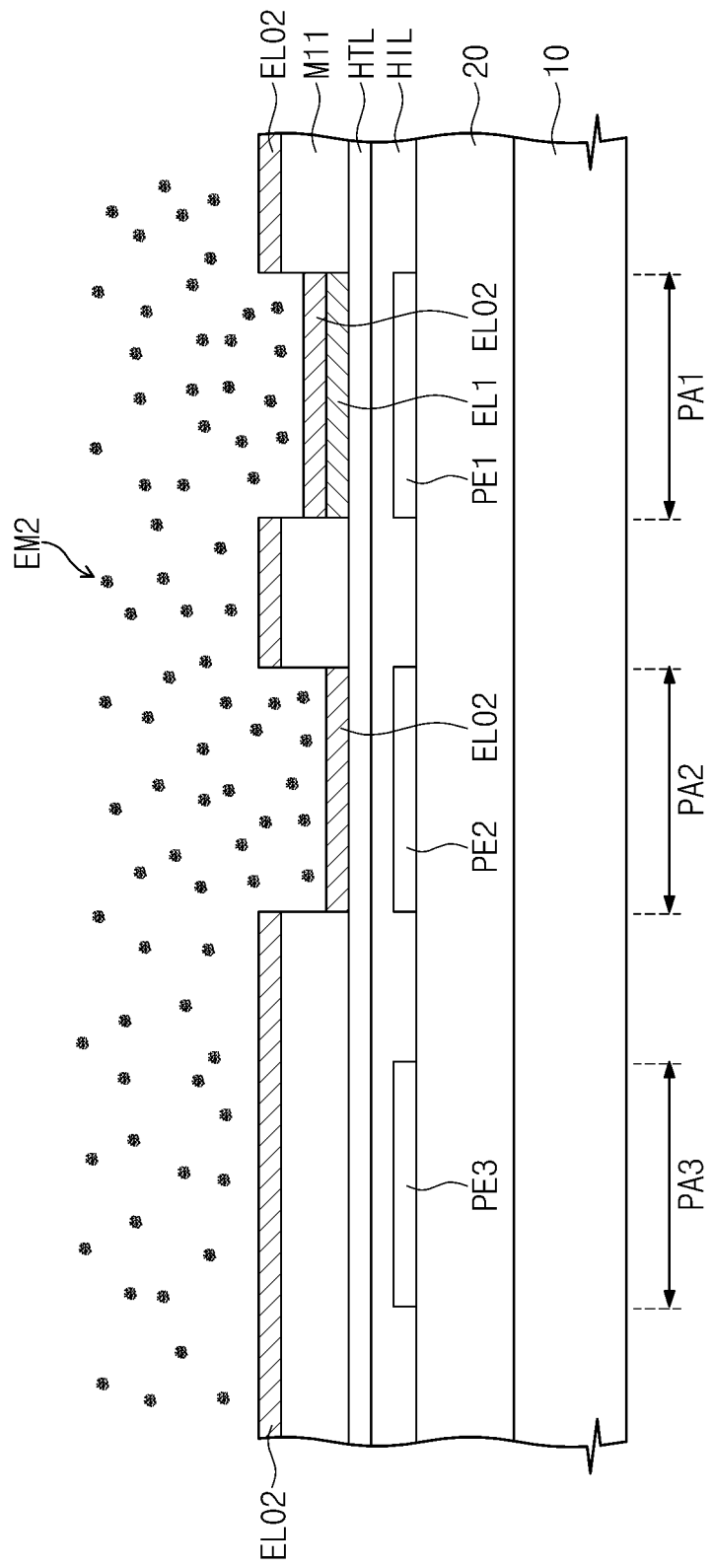
Figure 4E:
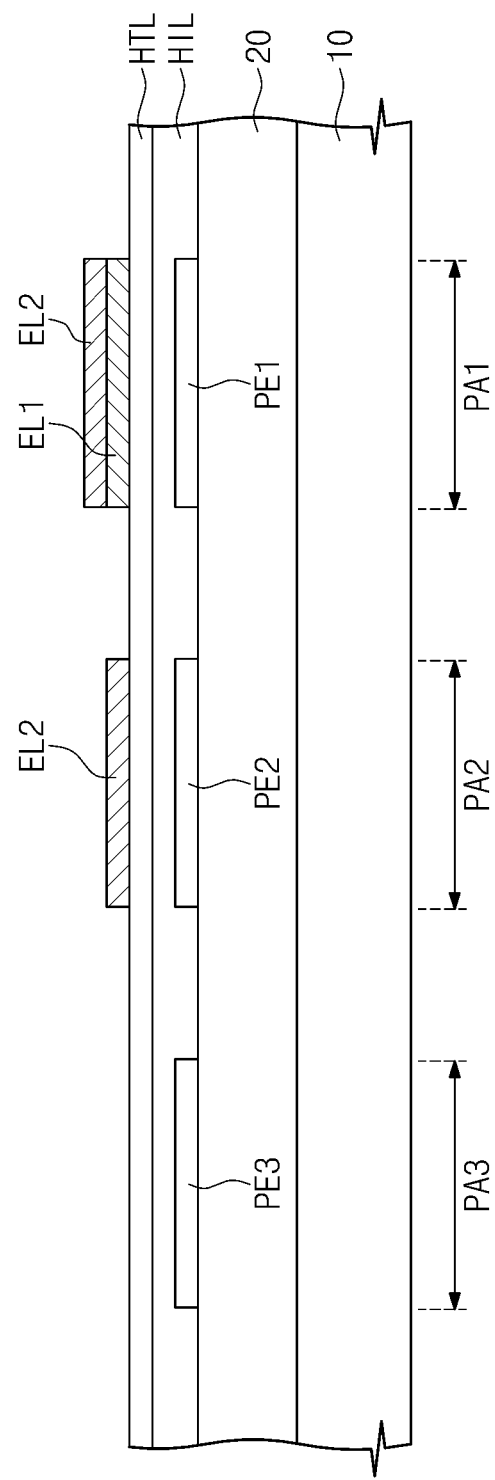

Referring to FIGS. 4D and 4E, after the first organic light emitting layer EL1 is formed, a second organic light emitting material EM2 is provided to the substrate 10. As a result, the second organic light emitting material EM2 is deposited on the first organic light emitting layer EL1 in the first pixel area PA1 and deposited on the hole transfer layer HTL in the second pixel area PA2. In addition, the second organic light emitting material EM2 is deposited on the first mask M11 in the other area except for the first and second pixel areas PA1 and PA2. Accordingly, a second preliminary organic light emitting layer ELO2 is formed on the first mask M11.

Then, the first mask M11 is removed from the substrate 10 after the second preliminary organic light emitting layer ELO2 is formed. As a result, the second preliminary organic light emitting layer ELO2 formed on the first mask M11 is removed from the substrate 10 together with the first mask M11, and the second preliminary organic light emitting layer ELO2 formed on the hole transfer layer HTL in the second pixel area PA2 and on the first organic light emitting layer EL1 in the first pixel area PA1 remains as a second organic light emitting layer EL2.

Referring to FIG. 4F, a fine metal mask FMM is disposed on the substrate 10. The fine metal mask FMM includes an opening formed therethrough corresponding to the third pixel area PA3. Then, a third organic light emitting material EM3 is provided to the substrate 10 to form a third organic light emitting layer EL3 in the third pixel area PA3. After that, when the process described with reference to FIG. 1J is performed on the substrate 10 on which the first, second, and third organic light emitting layers EL1, EL2, and EL3 are formed, the organic electroluminescent display is manufactured.

According to another embodiment, a process of providing the dopants DP described with reference to FIG. 2 to at least one of the first to third organic light emitting layers EL1 to EL3 may be added to the processes of manufacturing the organic electroluminescent display described with reference to FIGS. 4A to 4F. In this case, the colors of the lights exiting from the first to third pixel areas PA1 to PA3 may be easily controlled by the dopants DP.

In addition, according to another embodiment, a process of forming the first and second color filters CF1 and CF2 described with reference to FIG. 3 may be added to the processes of manufacturing the organic electroluminescent display described with reference to FIGS. 4A to 4F. In this case, the colors of the lights exiting from the first to third pixel areas PA1 to PA3 may be easily controlled by the first and second color filters CF1 and CF2.

Although certain embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method of manufacturing an organic electroluminescent display, comprising:
    preparing a substrate including a first pixel area and a second pixel area spaced apart from the first pixel area;
    disposing a first mask including openings formed therethrough on the substrate to respectively correspond to the first and second pixel areas;
    disposing a second mask including an opening formed therethrough corresponding to the first pixel area on the first mask to expose the first pixel area and cover the second pixel area;
    providing a first organic light emitting material to the substrate to form the first organic light emitting material in the exposed first pixel area;
    removing the second mask from the substrate to expose the first and second pixel areas;
    providing a second organic light emitting material to the substrate to form the second light emitting material in the exposed first and second pixel areas; and
    removing the first mask from the substrate.

2. The method of claim 1, wherein the first organic light emitting material is deposited on the first pixel area to form a first organic light emitting layer, and the second organic light emitting material is deposited on the first and second pixel areas to form a second organic light emitting layer.

3. The method of claim 2, wherein a first light exits from the first and second organic light emitting layers formed in the first pixel area, a second light exits from the second organic light emitting layer formed in the second pixel area, and the second light has a color different from a color of the first light.

4. The method of claim 3, further comprising providing a dopant to at least one of the first and second organic light emitting layers to control the color of at least one of the first and second lights.

5. The method of claim 3, further comprising forming at least one color filter on the substrate to filter the color of at least one of the first and second lights.

6. The method of claim 3, further comprising:
    disposing a third mask including an opening formed therethrough corresponding to a third pixel area spaced apart from the first and second pixel areas of the substrate after the first and second masks are removed from the substrate to expose the third pixel area; and
    depositing a third organic light emitting material on the exposed third pixel area to form a third organic light emitting layer from which a light having a color different from the first and second lights exits.

7. The method of claim 6, wherein the third mask is a metal mask.

8. The method of claim 6, further comprising:
    forming pixel electrodes respectively corresponding to the first, second, and third pixel areas prior to forming the first, second, and third organic light emitting layers;
    forming a hole injection layer on the pixel electrodes prior to forming the first, second, and third organic light emitting layers;
    forming a hole transfer layer on the hole injection layer prior to forming the first, second, and third organic light emitting layers;
    forming an electron transfer layer on the first, second, and third light emitting layers;
    forming an electron injection layer on the electron transfer layer; and
    forming a common electrode on the electron injection layer, wherein at least one of the hole injection layer, the hole transfer layer, the electron transfer layer, and the electron injection layer has a single-layer structure to be formed in the first, second, and third pixel areas.

9. The method of claim 2, wherein the first organic light emitting material deposited on the second mask is removed together with the second mask while the second mask is removed from the substrate, and the second organic light emitting material deposited on the first mask is removed together with the first mask while the first mask is removed from the substrate.

10. The method of claim 1, wherein each of the first and second masks has a film shape.

11. A method of manufacturing an organic electroluminescent display, comprising:
    preparing a substrate including first, second, and third pixel areas spaced apart from each other;
    disposing a first mask including openings formed therethrough to respectively correspond to the first, second, and third pixel areas on the substrate;
    disposing a second mask including openings formed therethrough to respectively correspond to the first and second pixel areas on the first mask;
    disposing a third mask including an opening formed therethrough corresponding to the first pixel area on the second mask to expose the first pixel area and cover the second and third pixel areas;
    providing a first organic light emitting material to the substrate to form the first organic light emitting material in the exposed first pixel area;
    removing the third mask from the substrate to expose the first and second pixel areas;
    providing a second organic light emitting material to the substrate to form the second light emitting material in the exposed first and second pixel areas;
    removing the second mask from the substrate to expose the first, second, and third pixel areas;
    providing a third organic light emitting material to the substrate to form the third light emitting material in the exposed first, second, and third pixel areas; and
    removing the first mask from the substrate.

12. The method of claim 11, wherein the first organic light emitting material is deposited on the first pixel area to form a first organic light emitting layer, the second organic light emitting material is deposited on the first and second pixel areas to form a second organic light emitting layer, and the third organic light emitting material is deposited on the first, second, and third pixel areas to form a third organic light emitting layer.

13. The method of claim 12, wherein a first light exits from the first, second, and third organic light emitting layers formed in the first pixel area, a second light exits from the second and third organic light emitting layers formed in the second pixel area, a third light exits from the third organic light emitting layer formed in the third pixel area, and the first, second, and third lights have different colors from each other.

14. The method of claim 13, further comprising providing a dopant to at least one of the first, second, and third organic light emitting layers to control the color of at least one of the first, second, and third lights.

15. The method of claim 13, further comprising forming at least one color filter on the substrate to filter the color of at least one of the first, second, and third lights.

16. The method of claim 12, wherein the first organic light emitting material deposited on the third mask is removed together with the third mask while the third mask is removed from the substrate, the second organic light emitting material deposited on the second mask is removed together with the second mask while the second mask is removed from the substrate, and the third organic light emitting material deposited on the first mask is removed together with the first mask while the first mask is removed from the substrate.

17. The method of claim 12, further comprising:
forming pixel electrodes respectively corresponding to the first, second, and third pixel areas prior to forming the first, second, and third organic light emitting layers;
forming a hole injection layer on the pixel electrodes prior to forming the first, second, and third organic light emitting layers;
forming a hole transfer layer on the hole injection layer prior to forming the first, second, and third organic light emitting layers;
forming an electron transfer layer on the first, second, and third light emitting layers;
forming an electron injection layer on the electron transfer layer; and
forming a common electrode on the electron injection layer, wherein at least one of the hole injection layer, the hole transfer layer, the electron transfer layer, and the electron injection layer has a single-layer structure to be formed in the first, second, and third pixel areas.

18. The method of claim 11, wherein each of the first and second masks has a film shape.

\* \* \* \* \*